(12) United States Patent
Singrigowda et al.

(10) Patent No.: US 11,418,189 B2
(45) Date of Patent: Aug. 16, 2022

(54) HIGH VOLTAGE OUTPUT CIRCUIT WITH LOW VOLTAGE DEVICES USING DATA DEPENDENT DYNAMIC BIASING

(71) Applicant: Advanced Micro Devices, Inc., Santa Clara, CA (US)

(72) Inventors: Jagadeesh Anathahalli Singrigowda, Bengaluru (IN); Ashish Sahu, Whitefield (IN); Rajesh Mangalore Anand, Bangalore (IN); Aniket Bharat Waghide, Maharashtra (IN); Girish Anathahalli Singrigowda, Bengaluru (IN); Prasant Kumar Vallur, Hyderabad (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/081,540

(22) Filed: Oct. 27, 2020

(65) Prior Publication Data
US 2021/0409020 A1 Dec. 30, 2021

Related U.S. Application Data

(60) Provisional application No. 63/044,461, filed on Jun. 26, 2020.

(51) Int. Cl.
*H03K 19/0948* (2006.01)
*H03K 17/687* (2006.01)
(Continued)

(52) U.S. Cl.
CPC ... *H03K 17/6877* (2013.01); *G01R 19/16538* (2013.01); *G05F 3/205* (2013.01);
(Continued)

(58) Field of Classification Search
CPC ....... H03K 17/6877; H03K 19/018571; H03K 19/0948; H03K 19/00315;
(Continued)

(56) References Cited

U.S. PATENT DOCUMENTS

10,305,474 B2   5/2019   Lee
2015/0280714 A1  10/2015  Kumar
(Continued)

*Primary Examiner* — Jung Kim
(74) *Attorney, Agent, or Firm* — Zagorin Cave LLP (57) ABSTRACT

A driver circuit drives a high voltage I/O interface using stacked low voltage devices in the pull-up and pull-down portions of the driver. The transistor closest to the PAD in the pull-up portion receives a dynamically adjusted gate bias voltage adjusted based on the value of the data supplied to the output circuit and the transistor in the pull-down portion closest to the PAD receives the same dynamically adjusted gate bias voltage. The transistors closest to the power supply nodes receive gate voltages that are level shifted from the core voltage levels of the data supplied to the output circuit. The transistors in the middle of the pull-up and pull-down transistor stacks receive respective static gate voltages. The bias voltages are selected such that the gate-drain, source-drain, and gate-source voltages of the transistors in the output circuit do not exceed the voltage tolerance levels of the low voltage devices.

17 Claims, 10 Drawing Sheets

(51) Int. Cl.
  *H03K 19/0185*  (2006.01)
  *G05F 3/20*  (2006.01)
  *H03K 19/003*  (2006.01)
  *H03K 17/0812*  (2006.01)
  *G01R 19/165*  (2006.01)

(52) U.S. Cl.
  CPC . *H03K 17/08122* (2013.01); *H03K 19/00315* (2013.01); *H03K 19/018521* (2013.01); *H03K 19/018571* (2013.01); *H03K 19/0948* (2013.01)

(58) Field of Classification Search
  CPC ..... H03K 17/08122; H03K 19/018521; H03K 19/0944; H03K 19/094; H03K 19/018507; H03K 19/0185; G05F 3/205; G01R 19/16538
  See application file for complete search history.

(56) References Cited

U.S. PATENT DOCUMENTS

| 2016/0072502 A1* | 3/2016 | Chern | H03K 19/018521 327/261 |
|---|---|---|---|
| 2021/0067158 A1 | 3/2021 | Wu | |

\* cited by examiner

HIGH VOLTAGE OUTPUT CIRCUIT WITH LOW VOLTAGE DEVICES USING DATA DEPENDENT DYNAMIC BIASING

CROSS-REFERENCE TO RELATED APPLICATION(S)

This application claims the benefit of provisional application No. 63/044,461, filed Jun. 26, 2020, entitled "High Voltage Output Circuit With Low Voltage Devices Using Data Dependent Dynamic Biasing", naming Jagadeesh Anathahalli Singrigowda, et al., as inventors, which application is incorporated herein by reference in its entirety.

BACKGROUND

Description of the Related Art

Input/output (I/O) interfaces on integrated circuits communicate with other integrated circuits over communication pathways. The voltages that have to be supported by the I/O interfaces can vary but it is still common for I/O interfaces to support 3.3V signaling.

Figure 1:
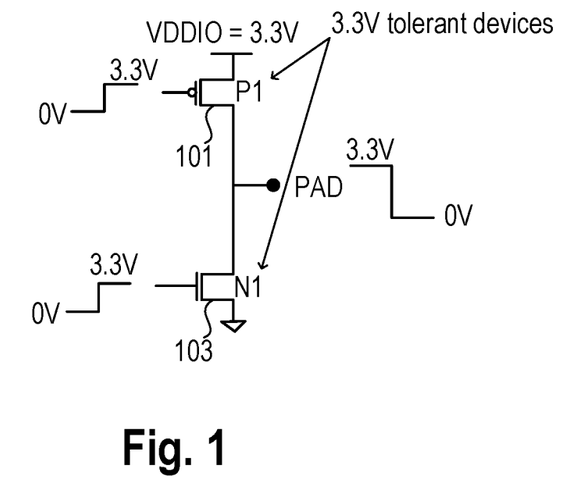
FIG. 1 illustrates an I/O design with 3.3V tolerant I/O devices.

CMOS technologies that supported 3.3V tolerant I/O devices allowed for design of 3.3V I/O applications without stress or reliability issues as the maximum operating voltage of the I/O thick oxide devices was nominally 3.3V. FIG. 1 shows an I/O design with 3.3V tolerant I/O devices P1 101 and N1 103. When the gate voltage of the P1 and N1 transistors are at 0V, P1 is ON and N1 is OFF and hence the PAD voltage is at 3.3V. When the gate voltage of the P1 and N1 transistors are at 3.3V, P1 is OFF and N1 is ON and hence the PAD voltage is at 0V. The PAD is the I/O terminal coupling the internal circuits to circuits external to the integrated circuit. In both cases, the maximum operating voltage of the I/O devices never exceeds the 3.3V tolerant voltage. Note that in 3.3V signaling, the output voltage of an I/O PAD can be at the nominal voltage of 3.3V or up to a maximum voltage of 3.63V (3.3V+10%). The maximum voltage tolerance (also referred to herein as the tolerant voltage) of the devices in the driver circuit to avoid overstress may also be the nominal voltage+10%. The use of 3.3V nominal devices such as shown in FIG. 1 allows for the simplest design with no overvoltage stress issues, however, the large area requirements of such devices make them unsuitable for lower technology nodes such as 5 nm.

More recent process technologies, such as 7 nm technology nodes, support 1.8V tolerant I/O devices. Such devices still need to operate in 3.3V I/O environment for certain I/O applications. The 1.8V transistors are fabricated to tolerate a maximum voltage of 1.98V (1.8V+10%) between gate and source, gate and drain, and drain and source. Voltage differences greater than 1.98V between any two terminals of a 1.8V device leads to overstress conditions, and exceeding these voltages results in shortening device lifetime.

Figure 2A:
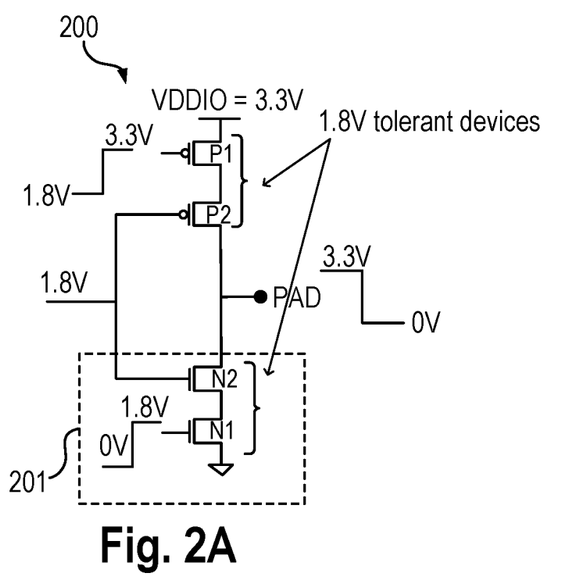
FIG. 2A illustrates a stacking approach for an output driver using 1.8V tolerant devices.

A popular solution for 1.8V I/O design is to stack two devices in series and provide appropriate biasing of transistors using reference voltage generation to protect the devices from Electrical Over-Stress (EOS) such that no device sees an overstress condition (voltage greater than the rated voltage between any two terminals). FIG. 2A shows one such stacking approach using 1.8V tolerant devices PMOS transistors P1, P2 and NMOS transistors N1, N2. For 3.3V signaling with 1.8V devices, stacking the 1.8V transistors and proper biasing avoids stressing the transistors. The transistor P2 and N2 receive a static gate biasing voltage of 1.8V. When the gate voltage of P1, P2 and N2 transistors are at 1.8V, P1 and P2 are ON and if the gate voltage of N1 is at 0V, N1 is OFF and hence the PAD voltage is at 3.3V. When gate voltage of the N1, N2 and P2 transistors are at 1.8V, N1 and N2 are ON and if the gate voltage of P1 is at 3.3V, P1 is OFF and hence the PAD voltage is at 0V. At any point of time, the driver circuit is biased in such a way that the potential difference between any two terminals of the MOSFET devices (gate-source (Vgs), gate-drain (Vgd), and drain-source (Vds)) does not exceed the 1.8V tolerant voltage to prevent stress on the device.

Figure 2B:
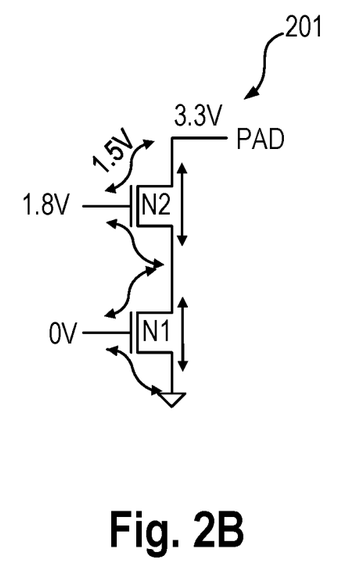
FIG. 2B illustrates the voltage differences between terminals of the pull-down portion of a stacked driver circuit using 1.8V tolerant devices.

FIG. 2B shows the voltage differences between terminals of the pull-down portion 201 of the driver 200 for 3.3V signaling. With the fixed bias voltage of 1.8V being supplied to the gate of NMOS transistor N2, the maximum voltage difference is 1.5V between any two terminals of the stacked devices, e.g., between the gate and drain of transistor N2. The main drawback of this approach is the need for a fixed bias voltage at the gate of the second device (N2) in the NMOS stack and the fixed bias voltage at the gate of the second device P2 in the PMOS stack to ensure that the overstress voltage condition does not occur to Vgs, Vds, or Vgd for any transistors in the output circuit While the approach shown in FIGS. 2A and 2B work for 1.8V tolerant devices found in older technologies, newest FINFET technologies need solutions to avoid overstress conditions. Cutting-edge semiconductor technologies support thick gate-oxide devices operating at reduced power supplies to cater to higher optimization mobile applications and high-performance computing applications as well as to achieve aggressive silicon area scaling. The voltage tolerance of thick oxide input/output (I/O) devices have drastically scaled down all the way from 5V to 1.5V. However, the I/O applications still need to support legacy interface standards operating at 5V or 3.3V. Stress on the lower voltage tolerant devices can negatively impact aging of the devices as the performance of the device degrades gradually. To avoid such stress and support 3.3V I/O applications with 1.5V tolerant devices, the designs must mitigate reliability issues like gate-oxide breakdown, hot carrier injection (HCI), positive/negative bias temperature instability (P/NBTI), electro-migration (EM) and stress-migration. If the potential difference between gate-source or gate-drain exceeds the voltage tolerance, the gate-oxide experiences increased electric fields due to the higher voltage operation. That can cause gate-oxide tunneling effects and result in failure of transistors over time. If the source-drain potential difference exceeds the voltage tolerance level, that can cause acceleration of charge carriers in the channel where they can gain momentum and damage the mobility factor and alter threshold voltage of devices. Hence, it is very important to make sure that the devices fabricated using the newest FINFET technologies avoid overstress conditions in output circuits where the operating voltage of the I/O is higher than the device tolerant voltage.

SUMMARY OF EMBODIMENTS OF THE INVENTION

In an embodiment an output circuit includes a driver circuit that includes a first transistor, a second transistor, and a third transistor arranged in a series stack in a pull-down portion of the driver circuit. The driver circuit is configured to drive data to an output node of the driver circuit. A dynamic bias circuit is configured to supply a variable gate voltage at a first voltage when the data has a first logical value and the variable gate voltage circuit is configured to supply the variable gate voltage at a second voltage when the data has a second logical value. The first transistor is coupled between the output node of the driver circuit and the second transistor and a gate of the first transistor is coupled to the variable gate voltage circuit. The second transistor is coupled between the first transistor and the third transistor and the second transistor has a second transistor gate coupled to a first static voltage. The third transistor is coupled between the second transistor and a ground node, and a gate of the third transistor is coupled to a third voltage responsive to the data having the first logical value and is coupled to a fourth voltage responsive to the data having the second logical value.

In another embodiment a method of supplying data received by an output circuit to an output node of the output circuit includes supplying a gate of a first transistor with a variable gate voltage that is a first voltage responsive to the data being at a first logical value and is a second voltage responsive to the data being at a second logical value. The first transistor carries current between the output node and a second transistor while the output circuit is supplying the first logical value of the data to the output node. A gate of the second transistor is supplied with a first static voltage equal to the first voltage. The second transistor carries current between the first transistor and a third transistor while the output circuit is supplying the first logical value of the data on the output node. The method further includes supplying a gate of the third transistor with a third voltage responsive to the data being at the second logical and supplying the gate of the third transistor with the first voltage responsive to the data being at the first logical value. The third transistor carries the current between the second transistor and a ground node through the third transistor while the output circuit is supplying the first logical value of the data to the output node.

In another embodiment an output circuit includes a pull-up stack of a driver circuit including first, second, and third PMOS transistors serially coupled between a power supply node and an output node of the driver circuit. A pull-down stack of the driver circuit includes first, second, and third NMOS transistors serially coupled between the output node and a ground node. The first PMOS transistor is coupled between the output node and the second PMOS transistor and the first PMOS transistor receives a variable gate voltage that varies according to data supplied to the output circuit for driving on the output node. The first NMOS transistor is coupled between the output node and the second NMOS transistor and the first NMOS transistor receives the variable gate voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

In the cutting edge FinFET technology nodes, all the transistor dimensions are being scaled down and the nominal supply voltage is being lowered in order to increase the performance (speed) while reducing the cost (area and power consumption). For example, with the recent scaling of FINFET process technologies, foundries may provide only 1.5V tolerant I/O devices, while System-on-a-Chip (SoC) I/O interfaces (and other integrated circuits) still have to operate in 1.8V or 3.3V I/O applications to support backward compatibility with industry interface standards and legacy specifications. These I/O specifications often signal at voltage levels (e.g., 3.3V) much higher than the nominal voltage tolerance (1.5V) of these devices. For compatibility with these standardized protocols and/or compatibility with integrated circuits from previous generations, designs in advanced FinFET processes need to interface at voltages higher than their nominal supply voltage. For example, in one 5 nm technology, 3.3V interfacing is required for integrated circuits realized in processes with a nominal supply voltage of 1.5V. Hence the design of I/O interfaces needs to be tolerant of high voltages and avoid electrical over stress. There are several approaches that can be explored to make a high-voltage-tolerant I/O design. All these approaches aim at handling high voltages, while ensuring sufficient lifetime, in a FinFET generation with a significantly lower nominal supply voltage and therefore lower voltage tolerance.

One approach involves fabricating high-voltage-tolerant (thick gate-oxide) transistors, by adding extra masks and processing steps to the baseline process, but such an approach adds to cost overhead. Another approach utilizes extended-drain devices that use lightly doped drain (LDD) CMOS with no additional process costs. However, the performance-per-area for LDD CMOS is relatively poor compared to baseline transistors. A third approach uses innovative circuit solutions to achieve high-voltage tolerant design using baseline transistors only. This solution involves circuit techniques that ensure that the voltages across all transistor terminals are always smaller than the maximum voltage tolerated by the device to ensure that device lifetime is not shortened by electrical over stress. Therefore, the goal is to operate in an environment where gate-source, gate-drain, or source-drain do not exceed the tolerated voltage to avoid electrical over stress.

Figure 3A:
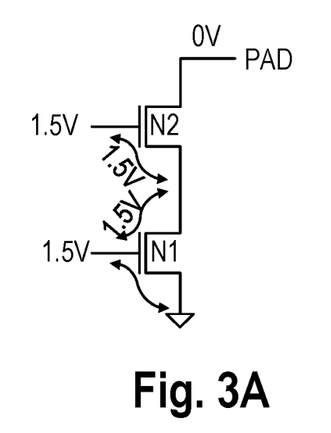
FIG. 3A illustrates a pull-down portion of a driver with a two stacked NMOS devices using 1.5V tolerant devices.
Figure 3B:
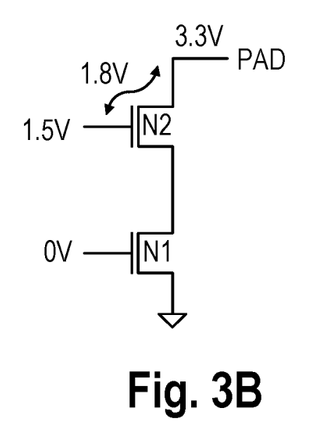
FIG. 3B illustrates stress on a pull-down portion of a driver with a two stack architecture using 1.5V tolerant devices.

While the approach shown in FIGS. 2A and 2B works for 1.8V tolerant devices, in 5 nm technology, at least some foundries only support 1.5V nominal devices. The designs using 1.5V devices still need to support industry standard 3.3V signaling. For certain 5 nm process technology, the maximum voltage allowed for 1.5V device is 1.65V (1.5V+ 10%×1.5V). Other process technologies may have a different percentage of the nominal voltage tolerance as the maximum. Thus, for ease of explanation, the nominal voltage tolerance of the devices will generally be used herein as the maximum tolerant voltage. 1.5V devices will be stressed if stacking techniques as used in previous technologies as shown in FIGS. 2A and 2B are used. For example, referring to FIG. 3A showing a pull-down portion of a driver with a stacked architecture, when the gate of N1 is 1.5V (N2 is on) and the PAD is at 0V, the maximum voltage at which the gate of N2 can be biased is 1.5V between gate and source of N2. Referring to FIG. 3B, with the biasing gate voltage of N2 at 1.5V, when the PAD is at 3.5V, the N1 gate is at 0V (N1 off). In this case device N2 will be stressed as the voltage (1.8V) between the gate and drain of N2 exceeds the maximum tolerant voltage of device, i.e., 1.5V. Such a solution results in overvoltage stress on the device and thus a stack of two is unable to solve the overvoltage stress condition for 1.5V devices.

Figure 4:
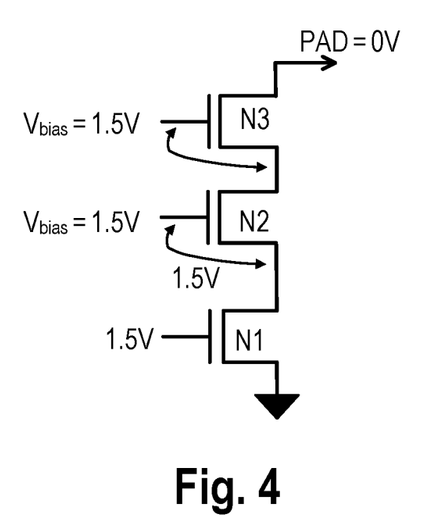
FIG. 4 illustrates operation of a pull-down portion of a driver with three stacked NMOS devices using 1.5V tolerant devices and static biasing.

As shown in FIG. 4, another potential approach increases the stack to three devices and statically biases the transistors closest to the PAD. Again, only the pull-down portion of the stack is shown. In FIG. 4, the PAD is at 0V so all of the NMOS transistors N1, N2, and N3 are on. The NMOS transistors N3 and N2 have a biasing voltage $V_{bias}$=1.5V and NMOS N1 is turned ON with gate voltage of 1.5V. To achieve maximum swing at the PAD $V_{bias}$ can be derived as follows:

$VN3_{gs}=VN3_g-VN3_s\leq$ Nominal voltage of a device=1.5 V, where $VN3_{gs}$ is the gate to source voltage for $N3$;

$VN3_{gs}=VN3_g-VN3_s\leq 1.5$ V; where $VN3_s$=0V, and $VN1_g=V_{bias}$ $VN3_{gs}=V_{bias}-0V\leq 1.5$ V;

$V_{bias}\leq 1.5$ V;  (a)

With $V_{bias}$ being 1.5V the maximum swing at PAD would be:

$V_{PAD}=V_{bias}$+maximum device tolerant voltage;

$V_{PAD}=1.5V+1.5V$;

$V_{PAD}=3.0V$;  (b)

Figure 5:
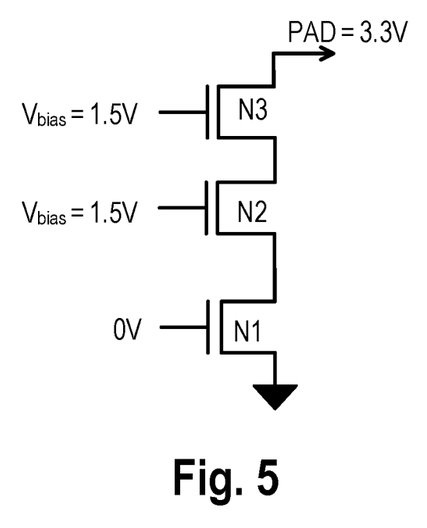
FIG. 5 illustrates an overstress condition associated with operation of a pull-down portion of a driver with three stacked NMOS devices using 1.5V tolerant devices and static biasing.

FIG. 5 illustrates operation of the pull-down portion of the driver with the PAD at 3.3V and N1 off. With equation (b) we conclude that even with stacking the maximum voltage that can be tolerated at the PAD can be 2*1.5V=3.0V. This shows that NMOS device N3 will be stressed if the output PAD voltage switches to 3.3V. So, for the output PAD voltage of 3.3V, stacking will not solve the EOS problem.

Figure 6:
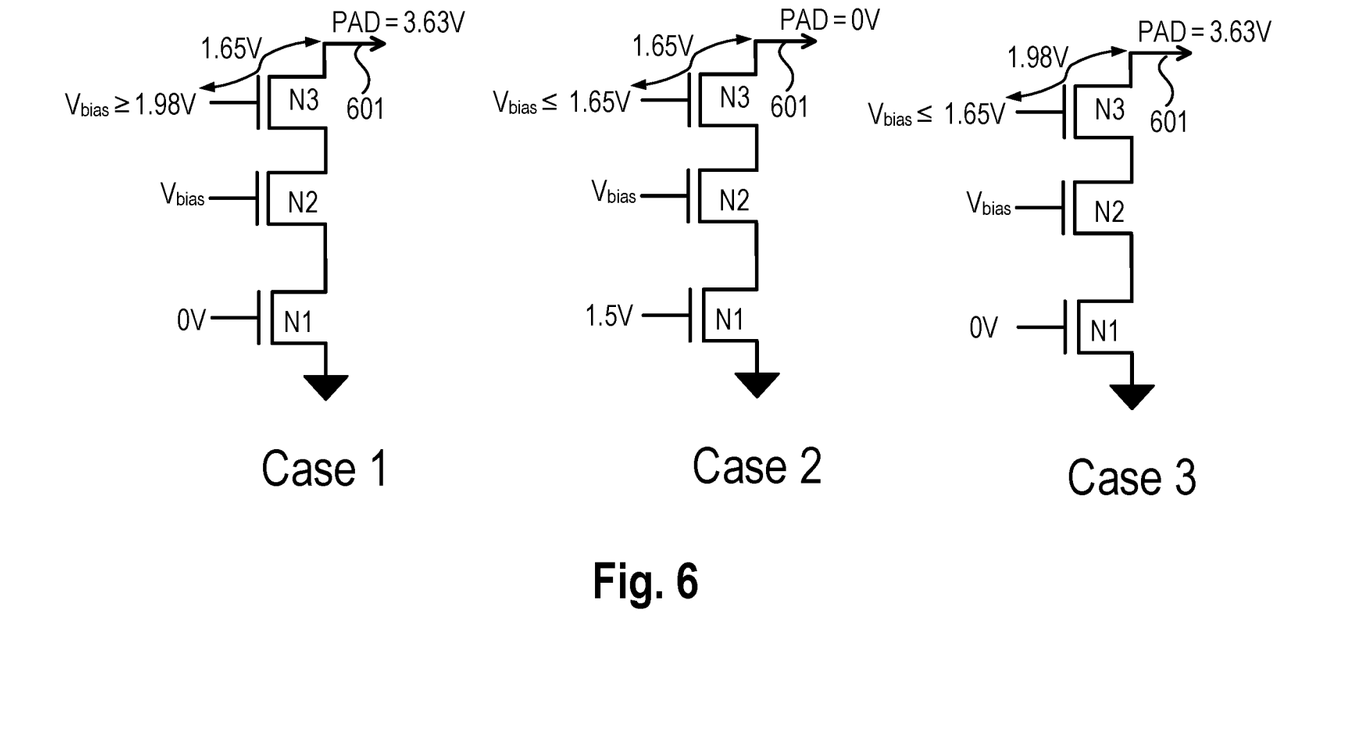
FIG. 6 illustrates limitations on static voltage biasing showing the pull-down portion of an output driver circuit.

FIG. 6 illustrates limitations on static voltage biasing showing the pull-down portion of an output driver circuit. In CASE 1 the voltage on the Output PAD 601 can be 3.63V (3.3V+10%*3.3V) in a worst voltage case scenario. Consider when the output PAD is at 3.63V and the NMOS transistor N1 is turned-off.

For $V_{PAD}=VN3_d=3.63V$ (where $VN3d$ is the drain voltage) to avoid stress for $N3$, $VN3_{dg}=VN3_d-VN3_g\leq$ nominal voltage of a device=1.65V $3.63V-VN3_g\leq 1.65V$ $VN3_g\geq 1.98V$ It is seen from the above equations that when the voltage at output PAD 601 is at the worst case voltage of 3.63V, a biasing voltage ≥1.98V is required to avoid overstress conditions for transistor N3. Now consider CASE2 with the voltage at the output PAD 601 at 0V.

For $V_{PAD}=VN3_d=0V$, to avoid stress for $N3$, $VN3_{gd}=VN3_g-VN3_d\leq$ nominal voltage of a device=1.65V $VN3-0V\leq 1.65V$ $VN3_g\leq 1.65V$ It is seen from the above equations that when the output PAD voltage is at 0V, a biasing voltage ≤1.65V is required to avoid overstress conditions for transistor N3. So, if the static biasing voltage applied to the gate of N3 in the first case, i.e. $V_{bias}\geq 1.98V$ is applied to the gate of N3 in the second case, then the device will see an overvoltage stress.

From CASE2, with the output PAD voltage as 0V, we need to apply $V_{bias}<=1.65V$ to the gate of N3 to avoid overvoltage stress conditions. However, in CASE 3 when the PAD switches from 0 to 3.63V, an overvoltage stress condition (Vgd=1.98V) exists with the PAD at the worst case 3.63V. The conclusion derived from all three cases shown in FIG. 6 is that static biasing cannot be used to solve the overvoltage stress problems while supporting 3.3V interfacing using 1.5V devices. In order to avoid overvoltage stress problems, a data dependent dynamic biasing solution eliminates overvoltage stress and reliability issues in the I/O designs that are using 1.5V devices but have I/O interface requirements of 3.3V.

Figure 7:
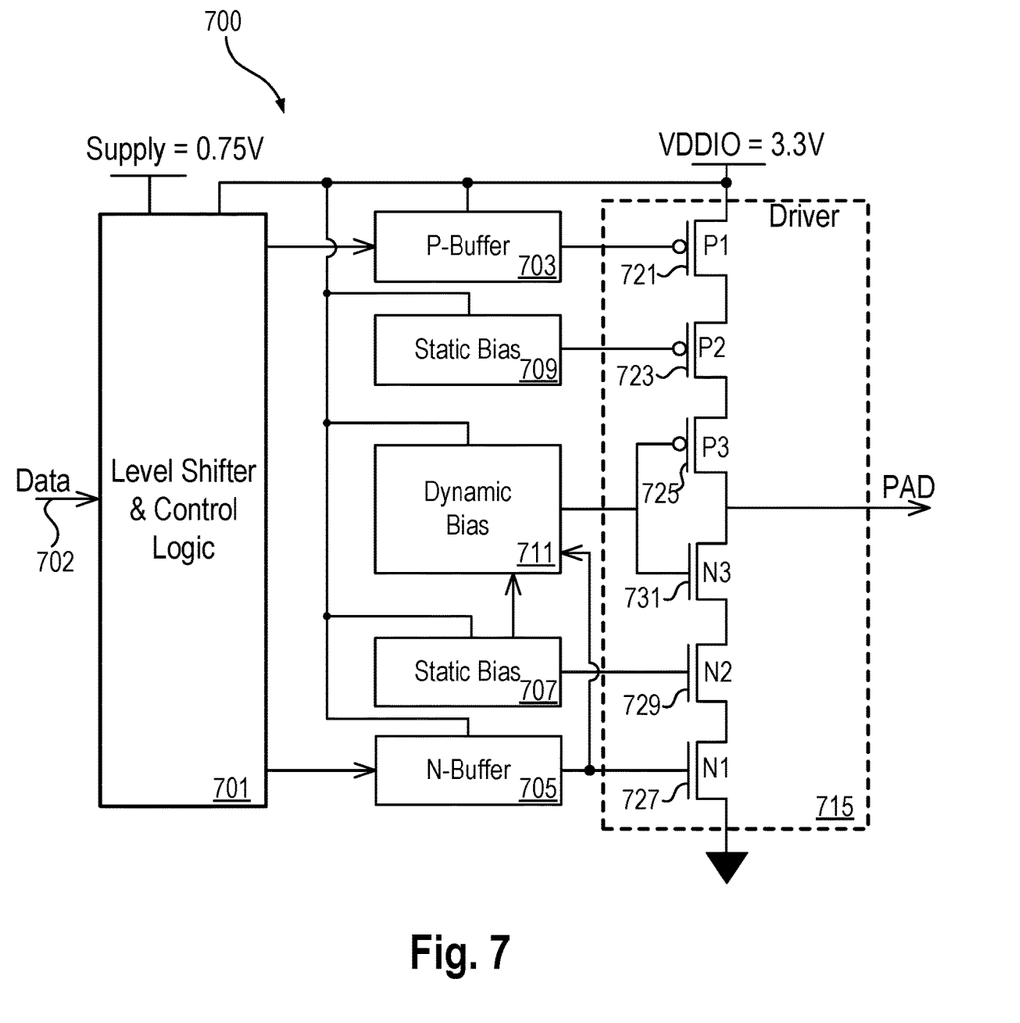
FIG. 7 illustrates a block diagram of an embodiment of a high voltage output circuit using low voltage devices that eliminates overvoltage stress and reliability issues by dynamically biasing the transistors closest to the output pad of the driver.

FIG. 7 illustrates a block diagram of an embodiment of a high voltage output circuit 700 that eliminates overvoltage stress and reliability issues. The output circuit embodiment of FIG. 7 includes level shifter and control logic 701 that shifts the voltage, e.g., from the supply voltage (0.75V and 3.3V) to the various voltages described in FIGS. 9 and 10 needed to achieve the needed biasing to avoid EOS. In addition the control logic provides the necessary control for switching the dynamic biasing voltages for the transistors closest to the PAD (the output terminal of the SOC or other integrated circuit) and for switching the level shifted voltage signals for the transistors closest to the power supply nodes (3.3V and ground). The level shifted voltage signals correspond to the logical high and low of the input data 702 to be driven to the PAD. In an embodiment the core data 702 supplied to the level shifter and control block 701 switches between 0V (low) and 0.75V (high). While shown as one block for convenience the functionality of block 701 may be provided in separate blocks. The high voltage output circuit 700 also includes P and N buffers 703 and 705 to supply the level shifted voltage signals to the driver 715. The high voltage output circuit 700 also includes static bias circuits 707 and 709, dynamic bias circuit 711, and output driver 715. The biasing of each of the transistors, including the static and dynamic biasing, along with the pre-driver buffers P-Buffer 703 and N-Buffer 705 ensure that the transistors in the output circuit always operate in the safe operating region such that the voltage between any two terminals of the devices does not exceed the voltage tolerance of the device. The output circuit 700 includes a driver 715 with a three transistor stack pull-up portion formed by PMOS transistors P1721, P2723, and P3725 and a three transistor stack pull-down portion formed by transistors N1727, N2729 and N3731.

The dynamic biasing circuit 711 dynamically adjusts the biasing of the transistors 725 and 731 closest to PAD (those transistors whose drains are connected to PAD), based on the logical value of the input data 702 such that the transistor gate-drain, source-drain and gate-source voltages do not exceed the device stress condition. The transistors 723 and 729 receive a different static bias voltage on their gates from the respective static bias circuits 709 and 707. The transistor P1721 receives its level shifted voltage from P-Buffer 703 with the value of the level shifted voltage dependent on the logical value of the data 702. The transistor N1727 receives its level shifted voltage from N-Buffer 705 with the level shifted voltage value dependent on the logical value of the input data 702.

Figure 8:
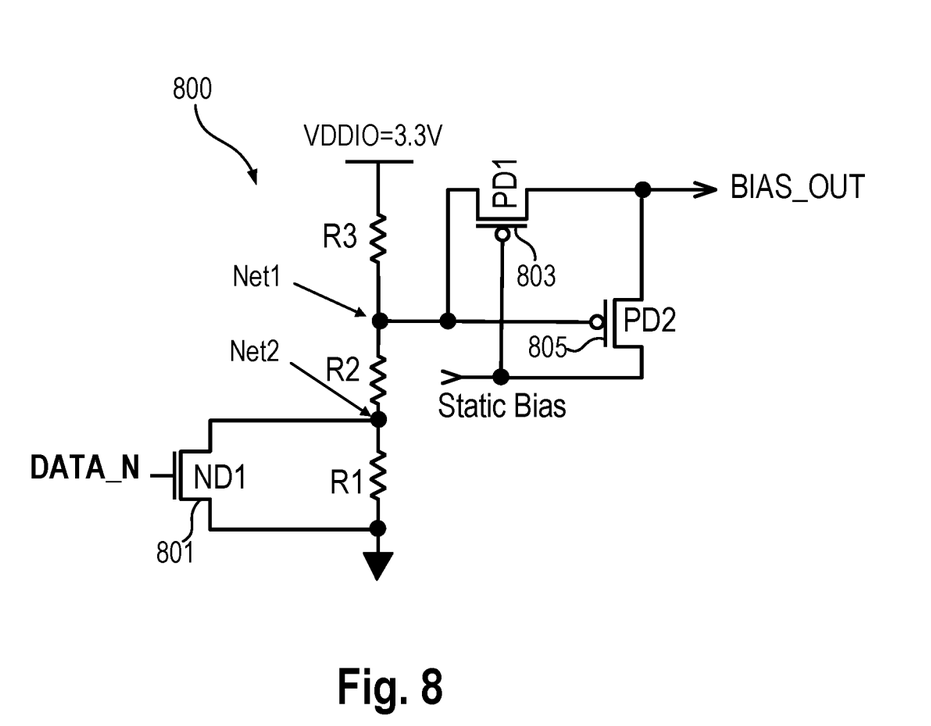
FIG. 8 illustrates an embodiment of a dynamic bias circuit used to dynamically bias the transistors closest to the output pad of the driver.
Figure 9:
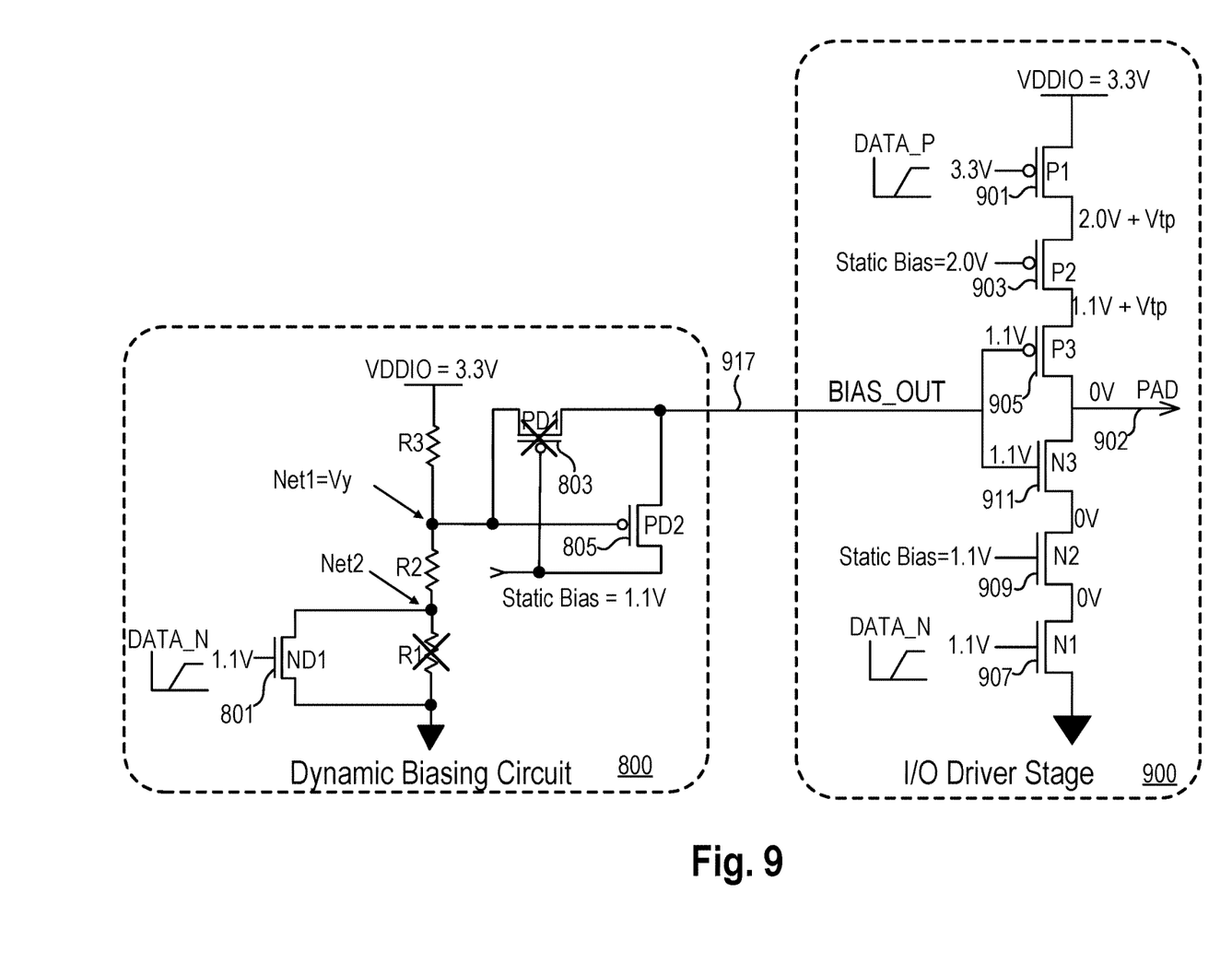
FIG. 9 illustrates a first case of operation of an output circuit that includes a dynamic biasing circuit and a driver stage.

FIG. 8 illustrates an embodiment 800 of the dynamic bias circuit 711. The three resistors R1, R2 and R3 are in series between the supply voltage (3.3V) and ground. An NMOS transistor 801 (ND1), which is controlled by input DATA_N, is connected in parallel with the resistor R1. As shown in FIG. 9, DATA_N is also supplied to the driver portion of the output circuit and is a level shifted signal corresponding to the logical value of data 702 supplied from the core of the integrated circuit. The main purpose of NMOS transistor 801 (ND1) is to bypass the resistor R1 when the input DATA_N is high. As the input DATA_N switches, the equivalent resistance between NET2 and ground also changes. That results in the voltage at NET1 varying with input DATA_N. The dynamic bias circuit 800 includes PMOS transistor PD1803 having a gate voltage driven by a static bias voltage. The dynamic bias circuit 800 further includes PMOS transistor PD2805 that has its gate driven by the voltage at NET1. The BIAS OUT signal dynamically biases the transistors closest to the PAD in the PMOS and NMOS stacks.

FIG. 9 illustrates an output circuit that includes the dynamic biasing circuit 800 coupled to the I/O driver stage 900. The I/O driver stage 900 is an embodiment of the driver circuit 715. The I/O driver stage 900 includes a stack of three PMOS devices P1 901, P2903, and P3905 and stack of three NMOS devices N1907, N2909, and N3911. The pull-up portion of the driver circuit 900 is coupled to a supply voltage of 3.3V. The input signal DATA_N supplied to the ND1 transistor 801 in the dynamic biasing circuit 800 switches between 0V and 1.5V (low to high) and DATA_P, supplied to the gate of driver transistor P1901 switches between 2.0V to 3.3V (low to high) depending on the logical value of the data 702 received by the output circuit, which logical value is being driven on the pad 902. To understand how the dynamic biasing circuit 800 generates different voltages with respect to input DATA_N and DATA_P, consider the following cases.

FIG. 9 illustrates the first case in which a logical low (0V) is being driven on the pad 902. In the first case DATA_N, which is a level shifted version of data 702 (see FIG. 7) rises from 0V to 1.1V, and the PAD switches from 3.3V to 0V. The NMOS device ND1 turns ON, thus bypassing resistor R1. The voltage on NET1 is generated by the resistor divider formed by resistors R3 and R2. Assume for this example that the voltage divider output Vy at NET1 is 0.4V (or other voltage appropriate to turn on PD2) and the static bias applied to the gate of PMOS PD1 and source of PMOS PD2 is 1.1V. The PMOS device PD2 is turned ON:

$$VPD2_{sg} = VPD2_s - VPD2_g \geq |VPD2_t|$$

$$VPD2_{sg} = 1.1 - 0.4 = 0.7 \geq |VPD2_t|$$

where $VPD2_t$ is the threshold voltage of VPD2. The PMOS device PD1 is turned OFF since its gate is at higher potential (1.1V) than its source potential (0.4V). With PD2 being ON, the static bias voltage of 1.1V appears at the BIAS_OUT node 917. The node 917 is the input to the gate of I/O driver transistors PMOS P3905 and NMOS N3911 and thus P3905 and N3911 receive a gate bias voltage of 1.1V. Hence when DATA_N is at logic high 1.1V and DATA_P is at logic high 3.3V, and static bias voltages 2.0V and 1.1V are applied to P2903 and N2909, respectively, the output PAD will be at 0V. The devices P3905 and N3911 are protected from stress as the BIAS_OUT voltage on node 917 is 1.1V. As shown in FIG. 9. none of the devices operate in a stress condition. The drains and sources of the pull-down transistors (N3, N2, N1) are all at 0 volts and the gate voltages are all at 1.1 V so the voltages (gate-source, gate-drain, source-drain) are all within the tolerance of the 1.5V devices. FIG. 9 also shows the drain/source voltages for the stacked devices: VP1d and VP2s=2.0V+Vtp, VP2d and VPP3s=1.1V+Vtp, and 0V for the remaining devices (where Vtp is the threshold voltage of the PMOS devices). The gate voltages are 3.3V for P1901, 2.0V for P2903 and 1.1V for P3905. Thus, all the voltages (gate-source, gate-drain, source-drain) for the pull-up transistor are within the tolerance of the 1.5V devices.

Figure 10:
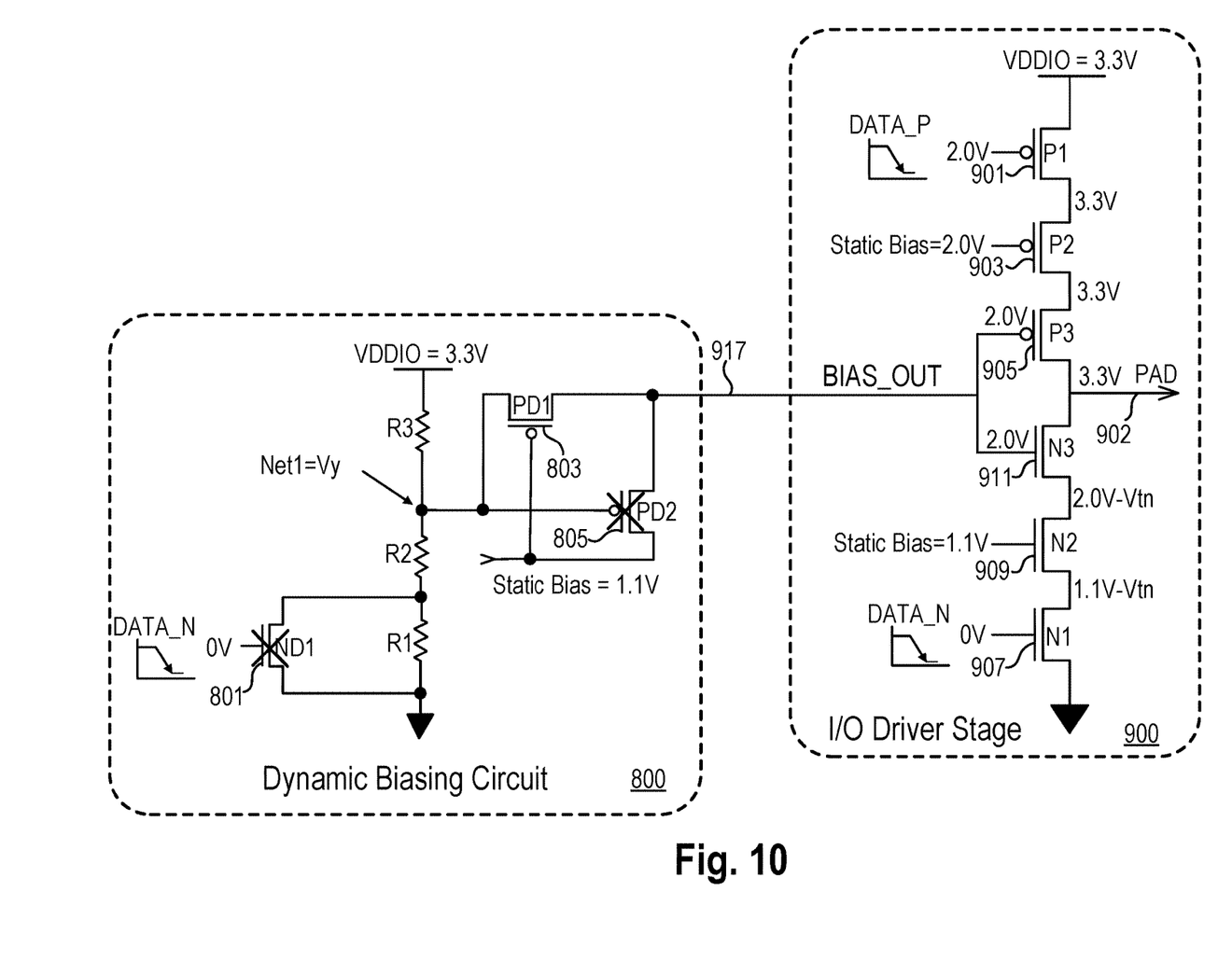
FIG. 10 illustrates a second case of operation of an output circuit that includes a dynamic biasing circuit and a driver stage.

FIG. 10 illustrates a second case for the input (DATA_N) falling from 1.1 V to 0 V, and the PAD 902 switching from 0V to 3.3V. The NMOS device ND1801 in the dynamic biasing circuit 800 turns OFF, thus allowing the resistor R1 to add to the total resistance of the divider. Now the voltage on NET1 is generated by the resistor divider formed by resistors R3, R2, and R1. The voltage divider in this embodiment is designed to have the voltage Vy at NET1=2.0 V in this case (or other appropriate voltage to ensure PD1 is turned on and PD2 is turned off) and the static bias applied to the gate of PMOS PD1803 and the source of PMOS PD2805 remains at 1.1V.

The PMOS device PD1803 is turned ON:

$$VPD1_{sg} = VPD1_s - VPD1_g \geq |VPD1_t|$$

$VPD1_{sg} = 2.0 - 1.1 = 0.9 \geq V|VPD1_t|$, where $VPD1_t$ is the threshold voltage of VPD1.

The PMOS device PD2 turns OFF since its gate is at a higher potential 2.0V than its source potential 1.1V. With transistor PD1803 being ON, the voltage 2.0V on NET1, appears at the BIAS_OUT node 917. Node 917 is the input to the gate of I/O driver transistors P3905 and N3911. Hence when DATA_N is at logic low of 0V and DATA_P is at logic low 2.0V, and static bias voltages 2.0V and 1.1V are applied to P2 903 and N2909, the output PAD will be at 3.3V as devices P1, P2, and P3 are all on. The devices P3 and N3 are protected from stress as the BIAS_OUT voltage (gate voltage) is 2.0V. As shown in FIG. 10 none of the devices operate in an overvoltage and therefore stress condition. The drains and sources of the PMOS pull-up transistors are all at 3.3V and the gate voltages are all at 2.0V so the voltages (gate-source, gate-drain, source-drain) are all within the tolerance of the 1.5V devices PMOS devices. FIG. 10 shows the drain/source voltages for the stacked devices (VN1d and VN2s=1.1V−Vtn, VN2d and VN3s=(2.0V−Vtn) (where Vtn is the threshold voltage for the N devices) and 3.3V for the remaining devices. The gate voltages are 0V for N1907, 1.1V for N2909 and 2.0V for N3911. Thus, all the voltages (gate-source, gate-drain, source-drain) for the pull-down NMOS transistor are within the tolerance of the 1.5V devices.

Figure 11:
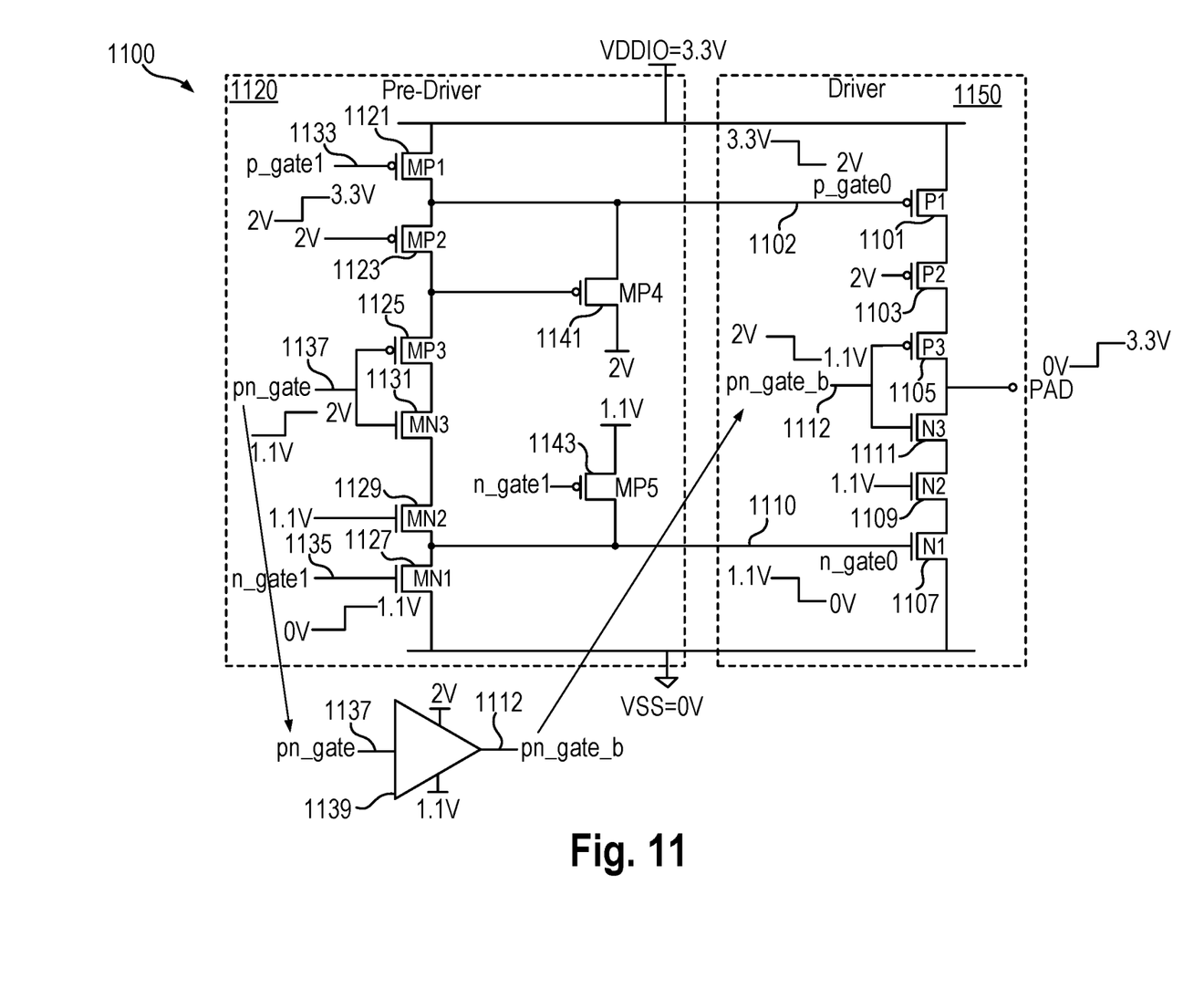
FIG. 11 illustrates an embodiment of an output circuit that dynamically adjusts the gate biasing of transistors closest to the PAD, provides level shifted gate voltage to transistors closest to the supply nodes, and supplies static bias voltages to the transistors in the middle of the pull-up and pull-down transistor stacks.

FIG. 11 illustrates an embodiment of an output circuit 1100 that utilizes a CMOS push-pull driver and pre-driver architecture to achieve 0 to 3.3V signaling using 1.5V tolerant devices without causing any stress on any of the PMOS or NMOS devices. Once the 3.3V VDDIO supply is stable, the output circuit 1100 transmits data (core data) (see 702 of FIG. 7) from the input of the output circuit to the PAD node. The output circuit 1100 dynamically adjusts the gate biasing of transistors closest to the PAD, provides level shifted gate voltages to transistors closest to the supply nodes, and supplies static bias voltages to the transistors in the middle of the pull-up and pull-down transistor stacks such that the gate-drain, source-drain, and gate-source voltages of the transistors do not exceed the device voltage tolerance levels and thereby avoids stress conditions. The embodiment of FIG. 11 shows additional details of an embodiment of a pre-driver circuit 1120 for use with the driver circuit 1150. The output circuit 1100 makes use of static biasing voltages and level shifted voltages to ensure that none of the transistors in the output circuit operate with voltages that cause stress conditions of the device. In contrast to the conventional 2-stacked transistors described earlier herein, or a 3-stacked approach with static biasing on the transistors closest to the PAD, the 3-stacked device pull-up and pull-down structure shown in FIG. 11 ensures 0V-3.3V signaling using 1.5V I/O devices without causing stress.

The driver 1150 includes PMOS transistors P1 1101, P2 1103, and P3 1105 that form the pull-up portion of the driver 1150. The driver 1150 further includes NMOS transistors N1 1107, N2 1109, and N3 1111 that form the pull-down portion of the driver 1150. The gate signal p_gate0 1102 received by transistor P1 1101 and the gate signal n_gate0 1110 received by transistor N1 1107 are the level-shifted signals of the core data (not shown in FIG. 11) supplied to the output circuit 1100 and determine whether the PAD should be pulled up to 3.3V or down to 0V. The gates of transistor P2 1103 and transistor N2 1109 in the driver 1150 receive a constant bias voltage of 2V and 1.1V, respectively. The values of the bias voltages are chosen such that there is no EOS seen on any of the driver devices for PAD transitions between 0V and 3.3V. In an embodiment, the core data input (not shown in FIG. 11) with 0.75V for a logic high and 0 volts for a logic low, is level-shifted to provide 0V (logic low) and 1.1V (logic high)) for driving n_gate1 1135 and is also level-shifted to provide 2V (logic low) and 3.3V (logic high)) to drive p_gate1 1133 to avoid electrical overstress (EOS) on 1.5V I/O devices but still support 3.3V signaling. During operation of the output circuit 1100, the bias voltages are generated in such a way that the devices do not cross the potential difference between any two terminals of the MOSFETs by more than the voltage tolerance, e. g., 1.5V. In an embodiment FIG. 11 output circuit 1100 receives data to be driven by the output circuit in a voltage regulator and control block similar to block 701 in FIG. 7 and provides appropriate shifted voltages and bias voltages as need by the predriver 1120 and the driver 1150.

The gates of transistor P3 1105 and N3 1111 are tied to 'pn_gate_b' 1112 and the voltage level is dynamically adjusted based on the data input to the output circuit to aid pull-up/down of the P1, P2 and N1, N2 transistors to limit any stress on the devices.

The pre-driver circuit 1120 includes PMOS transistors MP1 1121, MP2 1123 and MP3 1125 that form the pull-up devices of the pre-driver which drives 'p_gate0' 1102 to the gate of the P1 driver device 1101. The pre-driver circuit 1120 includes NMOS transistors MN1 1127, MN2 1129, and MN3 1131 that form the pull-down devices of pre-driver circuit 1120, which drives 'n_gate0' 1110 to the gate of the N1 driver device 1107. The gate signal p_gate1 1133 supplied to the transistor MP1 1121 and the gate signal n_gate1 1135 supplied to transistor MN1 1127 are the level-shifted signals of the data input and determine whether the driven devices P1 1101 and N1 1107 should be turned ON or OFF. Like the driver devices P2 1103 and N2 1109, the gates of the middle transistors MP2 1123 and MN2 1129 receive the constant bias voltages of 2V and 1.1V, respectively.

The gate input of MP3 1125 and MN3 1131 are tied to pn_gate 1137, which is derived based on the data input to the output circuit and have voltages selected to aid in pull-up/down of MP1, MP2 and MN1, MN2 transistors to limit any stress on devices. Note that the complimentary signal of pn_gate 1137 is pn_gate_b 1112, which is supplied to the gates of the transistors P3 1105 and N3 1111 of the driver circuit 1150. Dynamic bias circuit 1139 inverts the input to the dynamic bias circuit and supplies the inverted input as the output. Thus, if pn_gate 1137 equals 2V, the dynamic bias circuit 1139 provides 1.1V as the output pn_gate_b 1112. If pn_gate 1137 equals 1.1V, the dynamic bias circuit 1139 provides 2.0V as the output pn_gate_b 1112. The value of pn_gate depends on the logical value of the data input to the output circuit. Thus, the gate bias voltage of the transistors closest to the PAD dynamically changes with the logical value of the data being supplied to the output circuit and then driven on the PAD. The PMOS transistors MP4 1141 and MP5 1143 properly define p_gate0 1102 and n_gate0 1110 to 2V and 0V, respectively, for a low to high transition on the PAD. For a high to low transition, p_gate0 1102 and n_gate0 1110 are defined, respectively, to be 3.3V and 1.1V.

Figure 12:
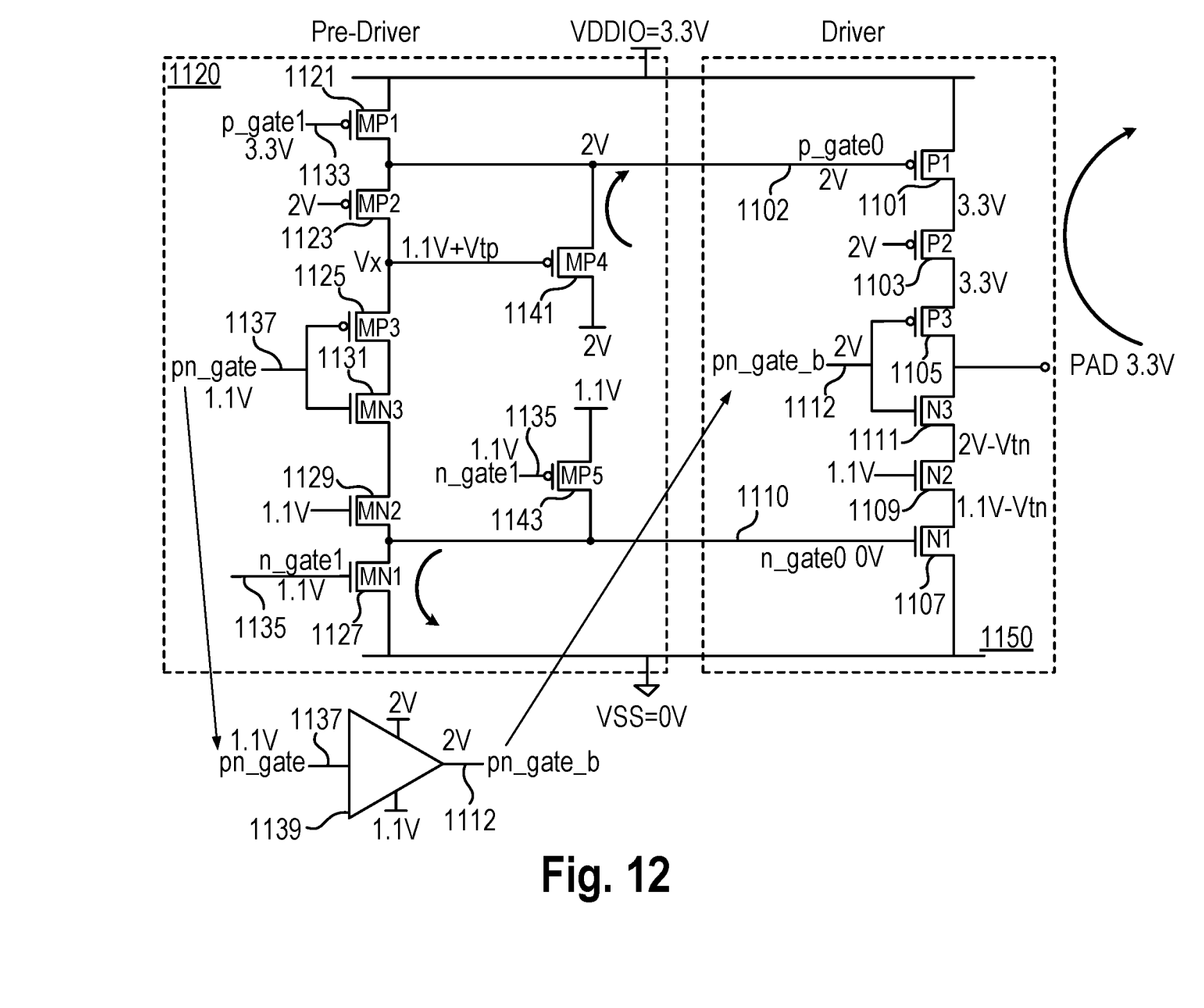
FIG. 12 illustrates a first operational case for the output circuit of FIG. 11.

FIG. 12 illustrates operation of the 3-stacked driver architecture (three devices in the pull-up and three devices in the pull-down portion) when the PAD is being driven to a logic high voltage of 3.3V. When the gate voltage of transistors MN1 1127, MN2 1129, and MN3 1131 are at 1.1V, they are turned ON and define n_gate0 1110 to 0V to turn off the N1 driver transistor 1107. At the same time, as the gate and source voltages of the MP5 transistor 1143 are both at 1.1V, MP5 is turned off and n_gate0 1110 is not multi-driven and is instead pulled to ground through transistor MN1 1127. Transistors MN1, MN2 and MN3 being ON will pull down Vx. Vx is pulled down to 1.1V+Vtp. Similarly, when the gate voltage of MP1 is at 3.3V, MP1 is turned off and p_gate0 1102 is driven by transistor MP4 1141 as the gate of MP4 1141 ($V_x$) is at (1.1V+Vtp). That results in MP4 supplying the static voltage value of 2V to p_gate0 1102 to turn on the driver transistor P1 1101.

At any point of time, no transistors in the pre-driver circuit 1120 have a potential difference across their terminals greater than the 1.5V tolerant voltage. FIG. 12 shows the drain/source voltages for the stacked devices, $VN1_d$ and $VN2_s=(1.1V-Vtn)$, $VN2_d$ and $VN3_s=(2V-Vtn)$, and 3.3V for the remaining devices. Transistors P3 1105 and N3 1111 are biased complimentary to transistors MP3 1125 and MN3 1131 to ensure proper transition of the PAD from 0V to 3.3V. With the gate voltage of the pull-up transistors P1, P2 and P3 at 2V, the gate-source voltage of these devices is (2V−3.3V) =|1.3V|, which is less than the 1.5V tolerant voltage of the devices to pull PAD to the high logic level with VDDIO=3.3V. The source-drain voltages are 3.3V for the pull-up devices. As the gate voltage of transistor N3 1111 is also at 2V, N3 1111 does not see any voltage stress on it as the N3 gate source node sees a (2V−Vtn) potential, which is again less than the 1.5V tolerant voltage, where Vtn is the voltage threshold of the N device. The drain source voltage for transistor N3 is 3.3V−(2V−Vtn). Nor do transistors N2 1109 or N1 1107 with their respective gate voltages at 1.1V and 0V see any voltage stress above permissible voltage levels. Thus, all the voltages (gate-source, gate-drain, source-drain) for the pull-down NMOS transistors are within the tolerance of the 1.5V devices.

In summary, to drive the pad at 3.3V the p_gate1 1133 is level shifted to its high logic level from its low logic level (2V to 3.3V) to turn off the MP1 transistor and 'p_gate0' is therefore defined to be 2V by the MP4 transistor 1141 which in turn turns on the P1 driver transistor 1101. For the pull-down stack in the pre-driver circuit 1120, n_gate1 1135 is level shifted from its low logic level (0V) to its high logic level (1.1V) to thereby turn on the MN1 transistor 1127 which defines n_gate0 to 0V which turns off the N1 driver transistor 1107. As the P2 driver transistor 1103 and the P3 driver transistor 1105 are biased to 2V, the PAD is pulled to 3.3V without stressing any of the device in the transition. The NMOS N3 driver transistor 1111 gate voltage is also biased to 2V to ensure it is not stressed when the PAD is at 3.3V.

Figure 13:
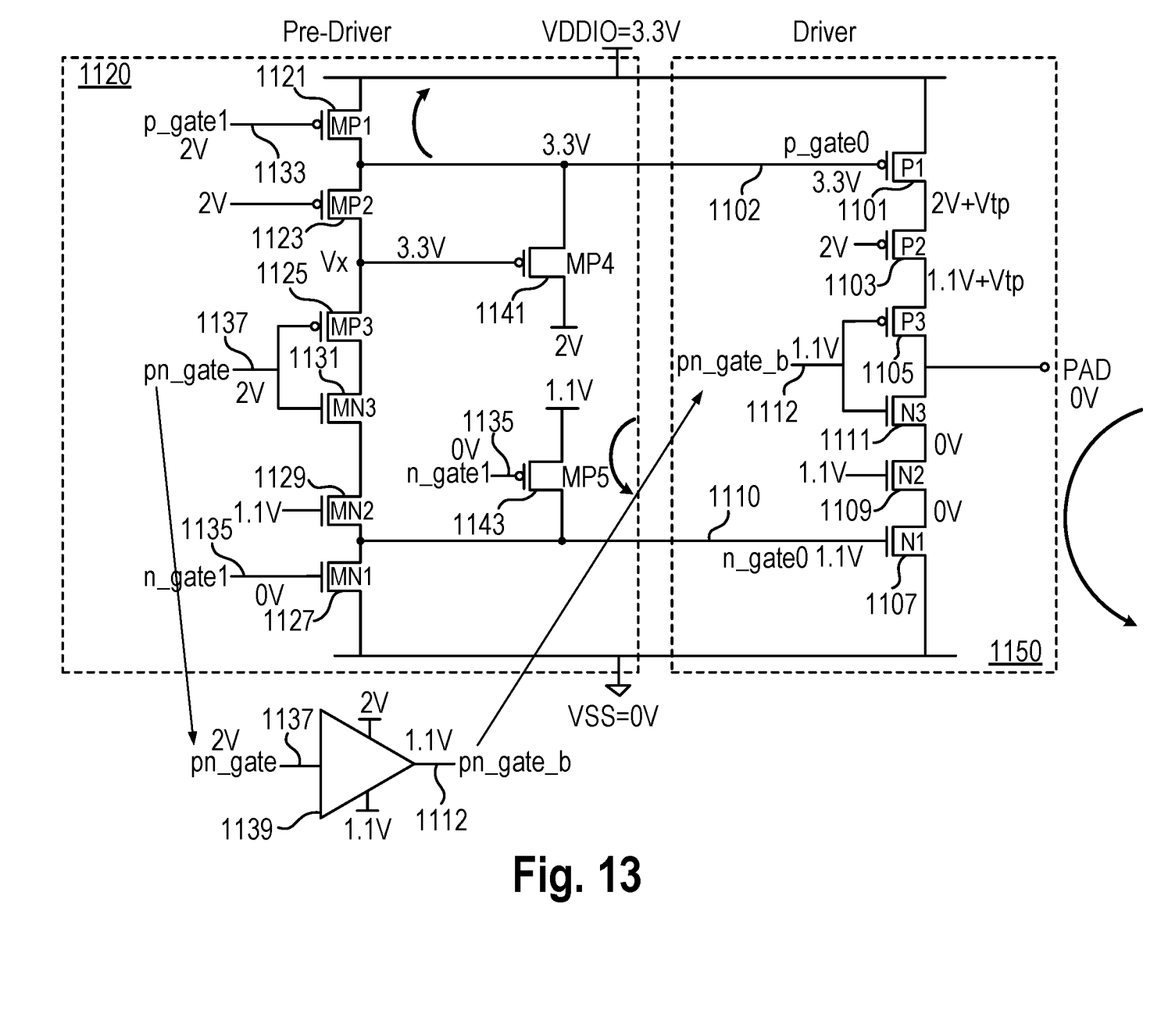
FIG. 13 illustrates a second operational case for the output circuit of FIG. 11.

FIG. 13 illustrates operation of the 3 stacked architecture when the PAD is being driven to a logic low level of 0V. With the gate voltage of transistors MP1 1121, MP2 1123, MP3 1125 and MN3 1131 at 2V, they are turned ON and define p_gate01102 to 3.3V to turn off the driver transistor P1 1101. At the same time, as the gate voltage of MP4 1141, $V_x$, is at 3.3V, MP4 is turned off and p_gate0 is not multi-driven and is pulled high to 3.3V through transistor MP1 1121. Similarly, when the gate voltage of transistor MN1 1127 is at 0V and MN1 1127 is turned off, the node n_gate0 1110 is driven by the transistor MP5 1143 as its gate voltage (n_gate1 1135)=0V and transistor MP5 1143 drives 1.1V voltage to n_gate0 to turn on the driver transistor N1 1107. At any point of time, no transistors in pre-driver circuit 1120 have a potential difference greater than the 1.5V tolerant voltage. FIG. 13 shows the drain/source voltages for the stacked devices, VP1d and VP2s=(2V+Vtp), VP2d and VP3s=(1.1V+Vtp) and 0V for the remaining devices. The transistors P3 1105 and N3 1111 are biased complimentary to transistors MP3 1125 and MN3 1131 to ensure proper transition of PAD from 3.3V to 0V. With the gate voltage of the N1, N2 and N3 transistors at 1.1V, the gate-source voltage of these devices is (1.1V−0V)=1.1V which is less than 1.5V tolerant voltage of the device to pull the PAD voltage to 0V. As the gate voltage of transistor P3 1105 is also at 1.1V, it does not see any higher voltage stress on it as the source of the P3 transistor is at a level such that the drain-source voltage (and gate-drain and gate-source voltages) are all less than the tolerant voltage. Similarly, the pull-up devices P1 1101 and P2 1103 have gate bias voltages that ensure all voltages (gate-source, gate-drain, source-drain) for these devices are within the tolerant voltage.

Thus, to drive the PAD at 0V (logic low), p_gate1 1133 receives a level shifted logic low signal of 2V, which is supplied to the gate of the MP1 transistor 1121 to turn on the MP1 transistor. Turning on the MP1 transistor 1121 defines p_gate01102 to 3.3V, which in turn disables the P1 driver transistor 1101. N_gate1 receives 0V to turn off the MN1 transistor 1127. That results in the MP5 transistor 1143 being defined at 1.1V, which turns on the N1 driver transistor 1107. As the gates of N2 1109 and N3 1111 are also biased to 1.1V, PAD is pulled to 0V without stressing any of the device in the transition. The gate bias voltage for P3 switches from 2V to 1.1V (at the same time as the gate of N3) to ensure that P3 is not stressed when the PAD is at 0V. Simulations show that the embodiments described herein work for typical, slow, fast, fast-slow, and slow-fast process corners as well as nominal VDDIO voltages of 3.3V±10% across expected temperature ranges, e.g., at 0° C., ~27° C., and 100° C., as well as variations in the supply voltage.

Thus, embodiments have been described that address avoiding stress in 3.3V signaling using 1.5V tolerant devices. The particular static and bias voltages may vary in embodiments, as long as the voltage tolerance is not exceeded. For example, certain embodiments may use a static bias voltage of 1.5 V instead of a static bias voltage of 1.1V. Other gate bias voltage levels (static or dynamic) may be adjusted according to the voltage tolerance of the particular process technology and the I/O signaling requirements. In addition, while the particular examples given have been for devices with a voltage tolerance of 1.5V and signaling requirements at 3.3V, the approach described herein can be applied to other voltage tolerances and signaling requirements. In addition, while the number of transistors in the pulldown and pullup stacks are shown as three in the examples given, other embodiments use additional transistors in the stack that are biased with appropriate static or dynamic gate voltages to ensure that the tolerant voltage of the transistors in the stack is not exceeded. Thus, as process technology continues to evolve providing lower voltage tolerances, the approach described herein can still be applied to avoid overstress.

Thus, the description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An output circuit to supply data received by the output circuit to an output node, comprising:
   a driver circuit including a first transistor, a second transistor, and a third transistor arranged in a stack in a pull-down portion of the driver circuit;
   a dynamic bias circuit configured to supply a variable gate voltage at a first voltage when the data has a first logical value and the dynamic bias circuit is configured to supply the variable gate voltage at a second voltage when the data has a second logical value;
   wherein the first transistor is coupled between the output node and the second transistor and wherein a gate of the first transistor is coupled to the variable gate voltage;

wherein the second transistor is coupled between the first transistor and the third transistor and the second transistor has a second transistor gate coupled to a first static voltage;

wherein the third transistor is coupled between the second transistor and a ground node, and wherein a gate of the third transistor is coupled to a third voltage responsive to the data having the first logical value and is coupled to a fourth voltage responsive to the data having the second logical value; and wherein the dynamic bias circuit includes an inverter circuit that is responsive to an input voltage to the inverter circuit being the first voltage to supply the second voltage as the variable gate voltage and is responsive to the input voltage to the inverter circuit being the second voltage to supply the first voltage as the variable gate voltage.

2. The output circuit as recited in claim 1 wherein the driver circuit further includes, a pull-up portion including a fourth transistor, a fifth transistor, and a sixth transistor arranged in a stack;

wherein the fourth transistor is coupled between the output node and the fifth transistor and wherein a gate of the fourth transistor is coupled to the variable gate voltage;

wherein the fifth transistor is coupled between the fourth transistor and the sixth transistor and wherein a gate of the fifth transistor is coupled to a second static voltage; and wherein the sixth transistor is coupled between the fifth transistor and a first supply voltage node providing a first supply voltage corresponding to a logical high voltage on the output node, and wherein a gate of the sixth transistor is coupled to a fifth voltage responsive to the data having the first logical value and is coupled to a sixth voltage responsive to the data having the second logical value.

3. The output circuit as recited in claim 2 wherein an output voltage on the output node nominally transitions between the fourth voltage and the fifth voltage and a voltage tolerance of the first, second, third, fourth, fifth, and sixth transistors is below the second voltage and the first and second voltages are selected to avoid electrical overstress on the first, second, third, fourth, fifth, and sixth transistors during operation of the output circuit.

4. The output circuit as recited in claim 2 wherein the first, second, and third transistors are NMOS transistors and the fourth, fifth, and sixth transistors are PMOS transistors.

5. The output circuit as recited in claim 2 wherein the fourth voltage is equal to a ground voltage, the fifth voltage is equal to the first supply voltage, the first static voltage is equal to the first voltage, the second static voltage is equal to the second voltage, the third voltage is equal to the first voltage and the sixth voltage is equal to the second voltage.

6. An output circuit to supply data received by the output circuit to an output node, comprising:

a driver circuit including a first transistor, a second transistor, and a third transistor arranged in a stack in a pull-down portion of the driver circuit and a fourth transistor, a fifth transistor, and a sixth transistor arranged in a pull-up portion of the driver circuit;

a dynamic bias circuit configured to supply a variable gate voltage at a first voltage when the data has a first logical value and the dynamic bias circuit is configured to supply the variable gate voltage at a second voltage when the data has a second logical value;

wherein the first transistor is coupled between the output node and the second transistor and wherein a gate of the first transistor is coupled to the variable gate voltage;

wherein the second transistor is coupled between the first transistor and the third transistor and the second transistor has a second transistor gate coupled to a first static voltage;

wherein the third transistor is coupled between the second transistor and a ground node, and wherein a gate of the third transistor is coupled to a third voltage responsive to the data having the first logical value and is coupled to a fourth voltage responsive to the data having the second logical value;

wherein the fourth transistor is coupled between the output node and the fifth transistor and wherein a gate of the fourth transistor is coupled to the variable gate voltage;

wherein the fifth transistor is coupled between the fourth transistor and the sixth transistor and wherein a gate of the fifth transistor is coupled to a second static voltage; and wherein the sixth transistor is coupled between the fifth transistor and a first supply voltage node providing a first supply voltage corresponding to a logical high voltage on the output node, and wherein a gate of the sixth transistor is coupled to a fifth voltage responsive to the data having the first logical value and is coupled to a sixth voltage responsive to the data having the second logical value;

wherein the dynamic bias circuit includes,
a first resistor coupled between the first supply voltage node and a first node in the dynamic bias circuit;
a second resistor coupled between the first node and a second node of the dynamic bias circuit;
a third resistor between the second node and the ground node; and
wherein the variable gate voltage is determined according to a first voltage divider formed of the first resistor, the second resistor and the third resistor responsive to the second logical value of the data being driven and is the first static voltage responsive to the first logical value of the data being driven.

7. The output circuit as recited in claim 6 wherein the dynamic bias circuit comprises:

a seventh transistor coupled between the second node and the ground node in parallel with the third resistor;
an eighth transistor having a first current carrying node coupled to the first node and having a second current carrying node coupled to the gate of the first transistor and coupled to the gate of the fourth transistor, a gate of the eighth transistor coupled to the first static voltage;
a ninth transistor having a third current carrying node coupled to the first static voltage and having a fourth current carrying node coupled to the gate of the first transistor, to the gate of the fourth transistor, and to the second current carrying node of the eighth transistor; and
wherein a gate of the ninth transistor is coupled to the first node.

8. The output circuit as recited in claim 6 wherein an output voltage on the output node nominally transitions between the fourth voltage and the fifth voltage and a voltage tolerance of the first, second, third, fourth, fifth, and sixth transistors is below the second voltage and the first and second voltages are selected to avoid electrical overstress on the first, second, third, fourth, fifth, and sixth transistors during operation of the output circuit.

9. The output circuit as recited in claim 6 wherein the first, second, and third transistors are NMOS transistors and the fourth, fifth, and sixth transistors are PMOS transistors.

10. The output circuit as recited in claim 6 wherein the fourth voltage is equal to a ground voltage, the fifth voltage is equal to the first supply voltage, the first static voltage is equal to the first voltage, the second static voltage is equal to the second voltage, the third voltage is equal to the first voltage and the sixth voltage is equal to the second voltage.

11. An output circuit to supply data received by the output circuit to an output node, comprising:
   a driver circuit including a first transistor, a second transistor, and a third transistor arranged in a stack in a pull-down portion of the driver circuit;
   a dynamic bias circuit configured to supply a variable gate voltage at a first voltage when the data has a first logical value and the dynamic bias circuit is configured to supply the variable gate voltage at a second voltage when the data has a second logical value;
   wherein the first transistor is coupled between the output node and the second transistor and wherein a gate of the first transistor is coupled to the variable gate voltage;
   wherein the second transistor is coupled between the first transistor and the third transistor and the second transistor has a second transistor gate coupled to a first static voltage;
   wherein the third transistor is coupled between the second transistor and a ground node, and wherein a gate of the third transistor is coupled to a third voltage responsive to the data having the first logical value and is coupled to a fourth voltage responsive to the data having the second logical value;
   a pre-driver circuit, the pre-driver circuit including,
      a first pre-driver transistor coupled between the gate of the third transistor and the ground node, a gate of the first pre-driver transistor having a gate voltage based on a logical value of the data;
      a second pre-driver transistor coupled between the gate of the third transistor and a third pre-driver transistor, wherein a gate of the second pre-driver transistor is coupled to the first static voltage;
      a fourth pre-driver transistor coupled between the gate of the third transistor and a second voltage supply node supplying a voltage equal to the first static voltage; and
      wherein the first, second, and third pre-driver transistors are NMOS and the fourth pre-driver transistor is PMOS.

12. The output circuit as recited in claim 11 wherein the driver circuit further includes,
   a pull-up portion including a fourth transistor, a fifth transistor, and a sixth transistor arranged in a stack,
   wherein the fourth transistor is coupled between the output node and the fifth transistor and wherein a gate of the fourth transistor is coupled to the variable gate voltage;
   wherein the fifth transistor is coupled between the fourth transistor and the sixth transistor and wherein a gate of the fifth transistor is coupled to a second static voltage; and
   wherein the sixth transistor is coupled between the fifth transistor and a first supply voltage node providing a first supply voltage corresponding to a logical high voltage on the output node, and wherein a gate of the sixth transistor is coupled to a fifth voltage responsive to the data having the first logical value and is coupled to a sixth voltage responsive to the data having the second logical value.

13. The output circuit as recited in claim 12 wherein an output voltage on the output node nominally transitions between the fourth voltage and the fifth voltage and a voltage tolerance of the first, second, third, fourth, fifth, and sixth transistors is below the second voltage and the first and second voltages are selected to avoid electrical overstress on the first, second, third, fourth, fifth, and sixth transistors during operation of the output circuit.

14. The output circuit as recited in claim 12 wherein the first, second, and third transistors are NMOS transistors and the fourth, fifth, and sixth transistors are PMOS transistors.

15. The output circuit as recited in claim 12 wherein the fourth voltage is equal to a ground voltage, the fifth voltage is equal to the first supply voltage, the first static voltage is equal to the first voltage, the second static voltage is equal to the second voltage, the third voltage is equal to the first voltage and the sixth voltage is equal to the second voltage.

16. The output circuit as recited in claim 11 wherein the pre-driver circuit further comprises:
   a fifth pre-driver transistor coupled between the gate of the sixth transistor and the first supply voltage node, a gate of the fifth pre-driver transistor having a gate voltage based on the logical value of the data;
   a sixth pre-driver transistor coupled between the fifth pre-driver transistor and a seventh pre-driver transistor, wherein a gate of the sixth pre-driver transistor is coupled to the second static voltage;
   an eighth pre-driver transistor coupled between the gate of the sixth transistor and a third supply voltage node supplying a voltage equal to the second static voltage; and
   wherein the fifth, sixth, seventh, and eighth pre-driver transistors are PMOS transistors.

17. The output circuit as recited in claim 16 wherein a current carrying node of the third pre-driver transistor is coupled to a current carrying node of the seventh pre-driver transistor and wherein the gate of the third pre-driver transistor and the gate of the seventh pre-driver transistor are coupled to a pre-driver gate signal voltage that is complementary to the variable gate voltage.

* * * * *